(12) United States Patent
Takagi

(10) Patent No.: US 8,637,873 B2
(45) Date of Patent: *Jan. 28, 2014

(54) PACKAGE AND HIGH FREQUENCY TERMINAL STRUCTURE FOR THE SAME

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

This patent is subject to a terminal disclaimer.

(21) Appl. No.: 13/164,155

(22) Filed: Jun. 20, 2011

(65) Prior Publication Data

US 2012/0126246 A1    May 24, 2012

(30) Foreign Application Priority Data

Nov. 18, 2010   (JP) ................................. 2010-258223

(51) Int. Cl.
*H01L 29/04*   (2006.01)
(52) U.S. Cl.
USPC .................................. 257/77; 257/76; 257/45
(58) Field of Classification Search
USPC ................................................. 257/77, 69, 76
See application file for complete search history.

(56) References Cited

U.S. PATENT DOCUMENTS

| | | | |
|---|---|---|---|
| 4,698,661 A | 10/1987 | Bessonneau et al. | |
| 6,020,613 A | 2/2000 | Udomoto et al. | |
| 7,411,288 B2 | 8/2008 | Takagi | |
| 7,576,423 B2 | 8/2009 | Takagi | |
| 7,659,613 B2 | 2/2010 | Takagi | |
| 2005/0104792 A1 | 5/2005 | Asao et al. | |

FOREIGN PATENT DOCUMENTS

| | | |
|---|---|---|
| EP | 0 110 997 A1 | 6/1984 |
| EP | 2 357 668 A1 | 8/2011 |
| JP | 3-268618 | 11/1991 |
| JP | 8-97320 A | 4/1996 |
| JP | 11-238823 A | 8/1999 |
| JP | 2000-183222 | 6/2000 |

OTHER PUBLICATIONS

U.S. Appl. No. 13/558,765, filed Jul. 26, 2012, Takagi.
Japanese Office Action Issued Jan. 22, 2013 in Patent Application No. 2011-250469 (with English translation).
The Extended European Search Report issued Jul. 8, 2013, in Application No./Patent No. 11170561.2-1552/2458630.
U.S. Appl. No. 13/871,149, filed Apr. 26, 2013, Takagi.

*Primary Examiner* — Howard Weiss
*Assistant Examiner* — Steven Rao
(74) *Attorney, Agent, or Firm* — Oblon, Spivak, McClelland, Maier & Neustadt, L.L.P.

(57) ABSTRACT

According to one embodiment, provided is a package and high frequency terminal structure for the same including: a conductive base plate; a semiconductor device disposed on the conductive base plate; a metal wall disposed on the conductive base plate to house the semiconductor device; a through-hole disposed in input and output units of the metal wall; a lower layer feed through inserted into the through-hole and disposed on the conductive base plate; and an upper layer feed through disposed on the lower layer feed through, and adhered to a sidewall of the metal wall. The lower layer feed through is surrounded by the metal wall.

13 Claims, 14 Drawing Sheets

PACKAGE AND HIGH FREQUENCY TERMINAL STRUCTURE FOR THE SAME

CROSS REFERENCE TO RELATED APPLICATIONS

This application is based upon and claims the benefit of priority from prior Japanese Patent Application No. P2010-258223 filed on Nov. 18, 2010, the entire contents of which are incorporated herein by reference.

FIELD

Embodiments described herein generally relate to a package and a high frequency terminal structure for such package.

BACKGROUND

Conventionally, a resin-sealed type and a sealed and airtight type are known as a package utilized for a semiconductor element.

The resin-sealed type semiconductor device has a structure which embedded directly the semiconductor element mounted in a leadframe in the resin by using a transfer mold etc., and is widely used by the advantage, such as low cost, being suitable for mass production, and a miniaturization being possible.

The sealed and airtight type semiconductor device has a structure which performed in hollow airtight maintenance of the semiconductor element mounted on a base substance composed of conductive materials, such as copper. Although the cost is higher compared with the resin-sealed type semiconductor device, the sealed and airtight type semiconductor device is used when high reliability is required because of excellent in airtightness.

In the sealed and airtight type package, it is known about an example of a package mounting a semiconductor element directly on the heat radiation body composed of metal, and including input/output terminal units having convex feed through structure.

In a package according to a conventional sealed and airtight type, the portion of the feed through is surrounded by a metal outer wall. Due to the feed through is surrounded by a metal outer wall, the impedance reduces rather than the impedance of a resin-sealed feed through.

BRIEF DESCRIPTION OF THE DRAWINGS

FIG. 1B is a schematic bird's-eye view showing the package according to the first embodiment, and is a schematic configuration diagram showing a metal seal ring 14a.

FIG. 14B is a schematic bird's-eye view showing the package according to the second embodiment, and is a schematic configuration diagram showing a metal seal ring 14a.

DETAILED DESCRIPTION

Figure 1A:
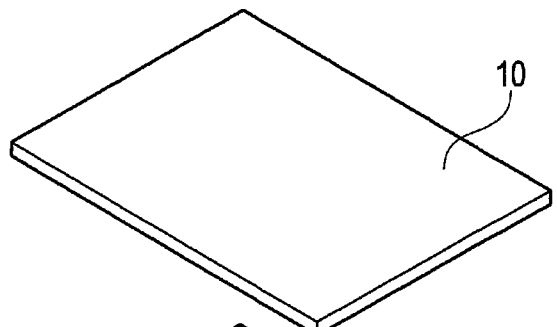
FIG. 1A is a schematic bird's-eye view showing a package according to a first embodiment, and is a schematic configuration diagram showing a metal cap 10.
Figure 1B:
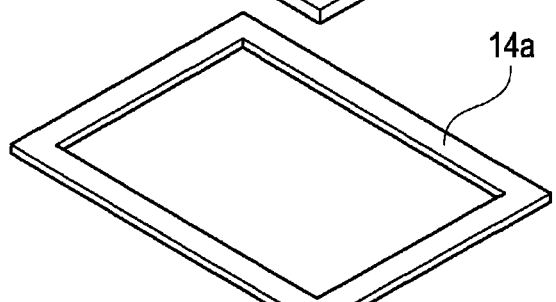
Figure 1C:
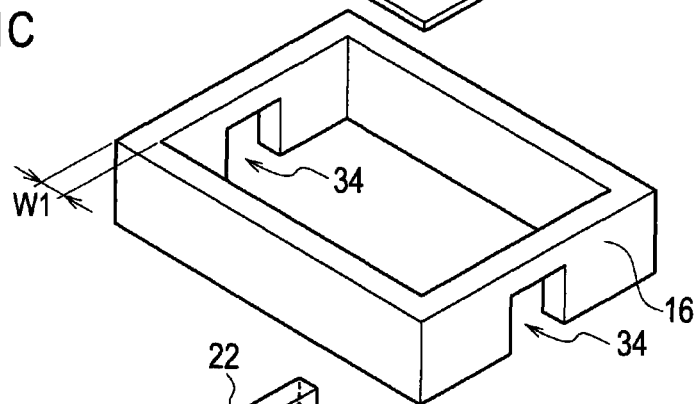
FIG. 1C is a schematic bird's-eye view showing the package according to the first embodiment, and is a schematic configuration diagram showing a metal wall 16.

Next, embodiments will be described with reference to drawings.

According to one embodiment, a package includes a conductive base plate, a semiconductor device, a metal wall, a through-hole, a lower layer feed through, and an upper layer feed through. The semiconductor device is disposed on the conductive base plate. The metal wall houses the semiconductor device and is disposed on the conductive base plate. The through-holes are formed at both of input and output units of the metal wall. The lower layer feed through is inserted into the through-hole, and is disposed on the conductive base plate. The upper layer feed through is disposed on the lower layer feed through, and is adhered to sidewall of the metal wall. The lower layer feed through is surrounded by the metal wall.

First Embodiment

Package Structure

A schematic bird's-eye view configuration for explaining a package according to a first embodiment is expressed as shown in FIG. 1. FIG. 1A shows a schematic configuration of a metal cap 10. FIG. 1B shows a schematic configuration of a metal seal ring 14a. FIG. 1C shows a schematic configuration of a metal wall 16. FIG. 1D shows a schematic configuration of lower layer feed through ($20i$ and $20o$) on a conductive base plate 200, an input stripline 19a and an output stripline 19b on the lower layer feed through ($20i$ and $20o$), and upper layer feed through 22 on the lower layer feed through $20i$.

As shown in FIG. 1, the package according to the first embodiment includes: the metal cap 10; the metal seal ring 14a; the metallic wall 16; the conductive base plate 200; the lower layer feed through ($20i$ and $20o$) disposed on the conductive base plate 200; the input stripline 19a and the output stripline 19b disposed on lower layer feed through ($20i$ and $20o$); and the upper layer feed through 22 disposed on the inside lower layer feed through $20i$.

(Conductive Base Plate 200)

The conductive base plate 200 of the package according to the first embodiment is formed of conductive metals, such as molybdenum and a copper molybdenum alloy, for example. Furthermore, electroplated conductors, such as Au, Ni, Ag, an Ag—Pt alloy and an Ag—Pd alloy, may be formed on the surface of the conductive base plate 200, for example.

(Lower Layer Feed Through $20i$ and $20o$ and Upper Layer Feed Through 22)

The lower layer feed through ($20i$ and $20o$) and the upper layer feed through 22 may be formed of the same material, for example, ceramics. The material of ceramics can be formed of alumina ($Al_2O_3$), aluminum nitride (AlN), beryllium oxide (BeO), etc., for example.

Figure 1D:
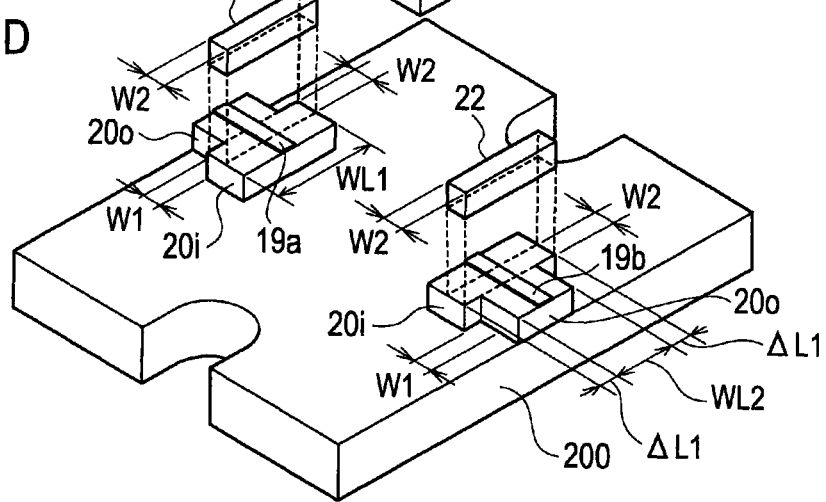
FIG. 1D is a schematic bird's-eye view showing the package according to the first embodiment, and is a schematic configuration diagram showing a lower layer feed through (20i and 20o) on a conductive base plate 200, and an input stripline 19a and an output stripline 19b on the lower layer feed through (20i and 20o), and an upper layer feed through 22 on the lower layer feed through 20i.

As shown in FIG. 1D, the width WL1 of the inside lower layer feed through $20i$ disposed at inside of the metal wall 16 is formed more widely than the width WL2 of the outside lower layer feed through $20o$ disposed at the outside of the metal wall 16 (where $WL1-WL2=2\Delta L1$, as shown in FIG. 1). Thus, the feed through can be contacted to the side surface of the metal wall 16, by forming the width WL1 of the inside feed through $20i$ and 22 more widely than the width WL2 of the through-hole of the metal wall 16.

(Input Stripline 19a and Output Stripline 19b)

The input stripline 19a and the output stripline 19b are formed of copper foil etc., for example. The width and thickness of the input stripline 19a and the output stripline 19b are determined in consideration of the material of the lower layer feed through ($20i$ and $20o$), and the value of matching impedance, in correspondence with the amount of electric power capability.

(Metal Wall 16)

The metal wall 16 is formed of conductive metals, such as KOVAL and a copper molybdenum alloy, for example.

A soldering metal layer (not shown) for soldering is formed on the top surface of the metallic wall 16 via the metal seal ring 14a. The solder metal layer can be formed of a gold germanium alloy, a gold tin alloy, etc., for example.

(Metal Cap 10)

The metal cap 10 has a flat plate shape as shown in FIG. 1. The metal cap 10 is formed of conductive metals, such as a copper molybdenum alloy, for example.

The metal cap 10 is disposed on the metallic wall 16 via the metal seal ring 14a.

As a result, the package according to the first embodiment includes the metal wall 16, the metal seal ring 14a disposed on the metal wall 16, and the metal cap 10 disposed on the metal wall 16 via the metal seal ring 14a, as shown in FIG. 1.

The semiconductor package according to the first embodiment has the high frequency characteristics of not less than 2 GHz. Accordingly, the package according to the first embodiment is applicable as a package for devices and component parts having high frequency (that is, frequency over 2 GHz).

(Plane Pattern Configuration)

Figure 2:
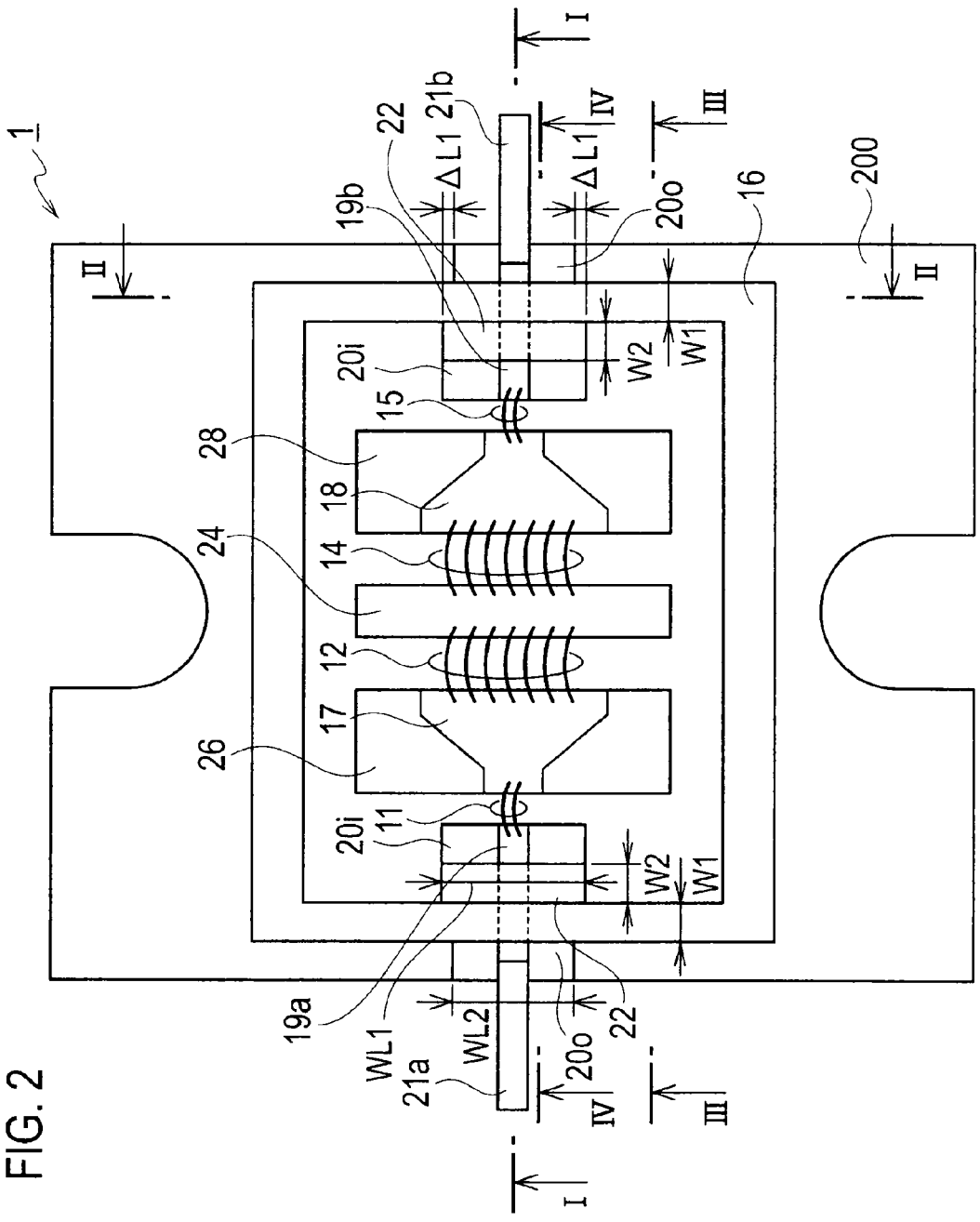
FIG. 2 is a schematic planar pattern configuration diagram showing the package according to the first embodiment.

A schematic planar pattern configuration of the package 1 according to the first embodiment is expressed as shown in FIG. 2. Also, a schematic cross-sectional structure taken in the line I-I of FIG. 2 is expressed as shown in FIG. 3.

Figure 4:
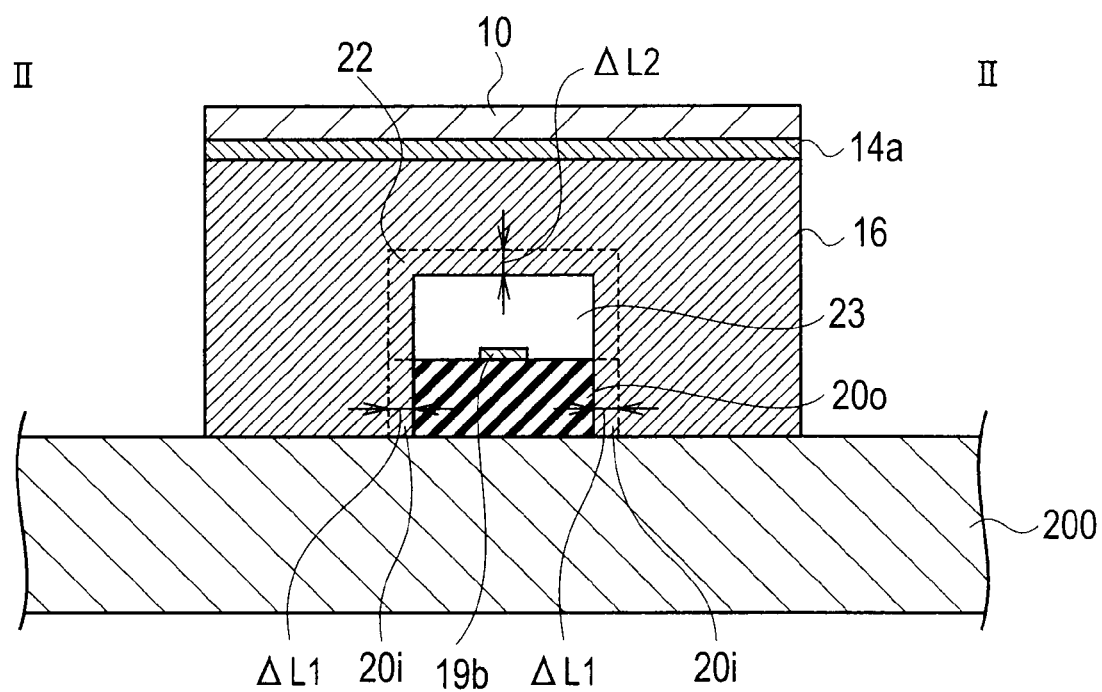
FIG. 4 is a schematic cross-sectional configuration showing the package according to the 1st embodiment, and is a schematic cross-sectional configuration diagram taken in the line II-II of FIG. 2.
Figure 5:
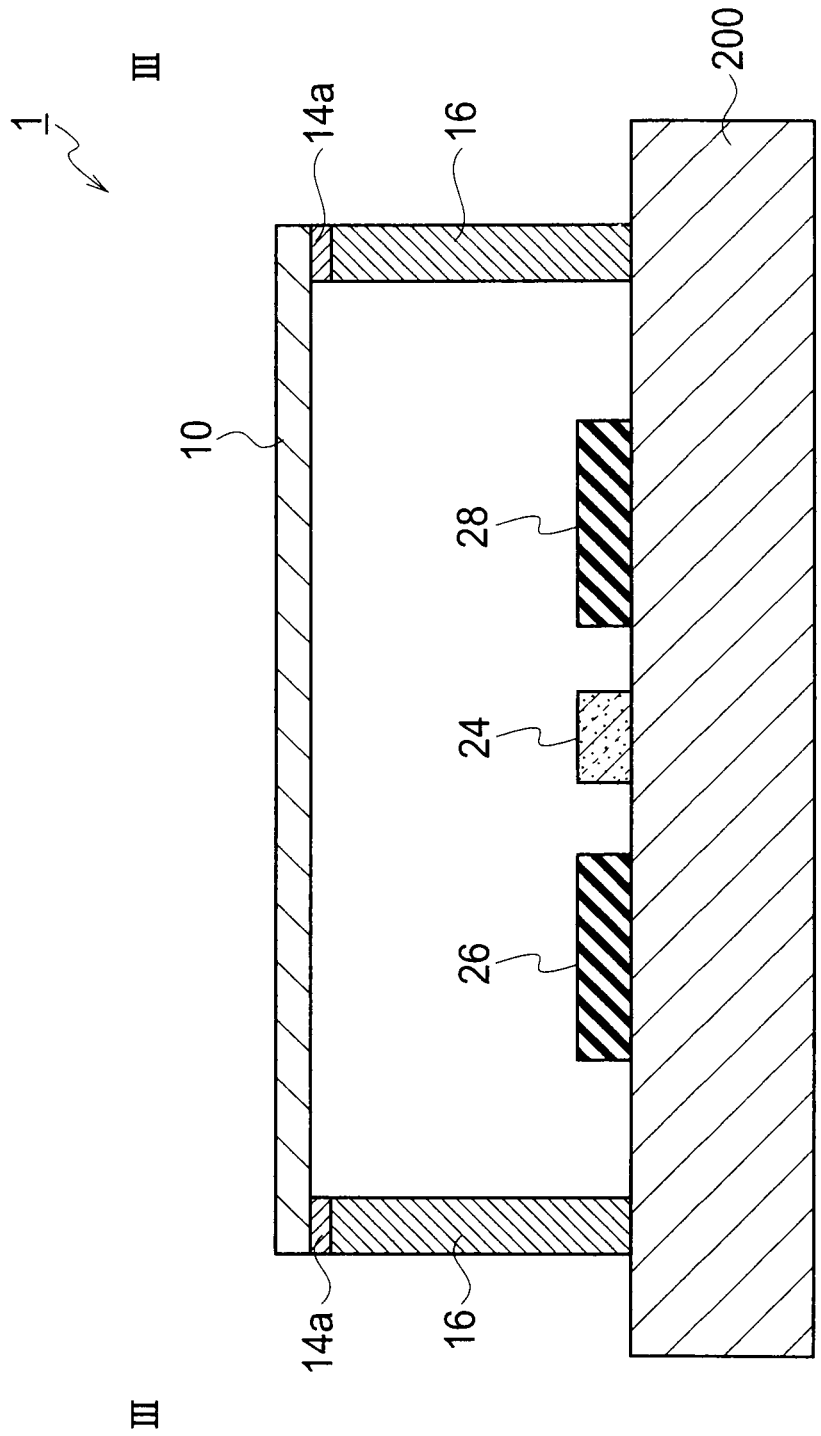
FIG. 5 is a schematic cross-sectional configuration showing the package according to the first embodiment, and is a schematic cross-sectional configuration diagram taken in the line III-III of FIG. 2.

Also, a schematic cross-sectional structure taken in the line II-II of FIG. 2 is expressed as shown in FIG. 4, and a schematic cross-sectional structure taken in the line of FIG. 2 is expressed as shown in FIG. 5. Also, a schematic cross-sectional structure taken in the line IV-IV of FIG. 2 is expressed as shown in FIG. 6.

As shown in FIG. 1 to FIG. 6, a configuration example of the package 1 according to the first embodiment includes: the conductive base plate 200; the semiconductor device 24 disposed on the conductive base plate 200; the metal wall 16 which houses the semiconductor device 24 and is disposed on the conductive base plate 200; the through-holes 34 formed at both the input and output units of the metal wall 16; the lower layer feed through ($20i$ and $20o$) inserted into the through-hole 34, and disposed on the conductive base plate 200; and the upper layer feed through 22 disposed on the inside lower layer feed through $20i$, and adhered to the sidewall of the metal wall 16.

Figure 3:
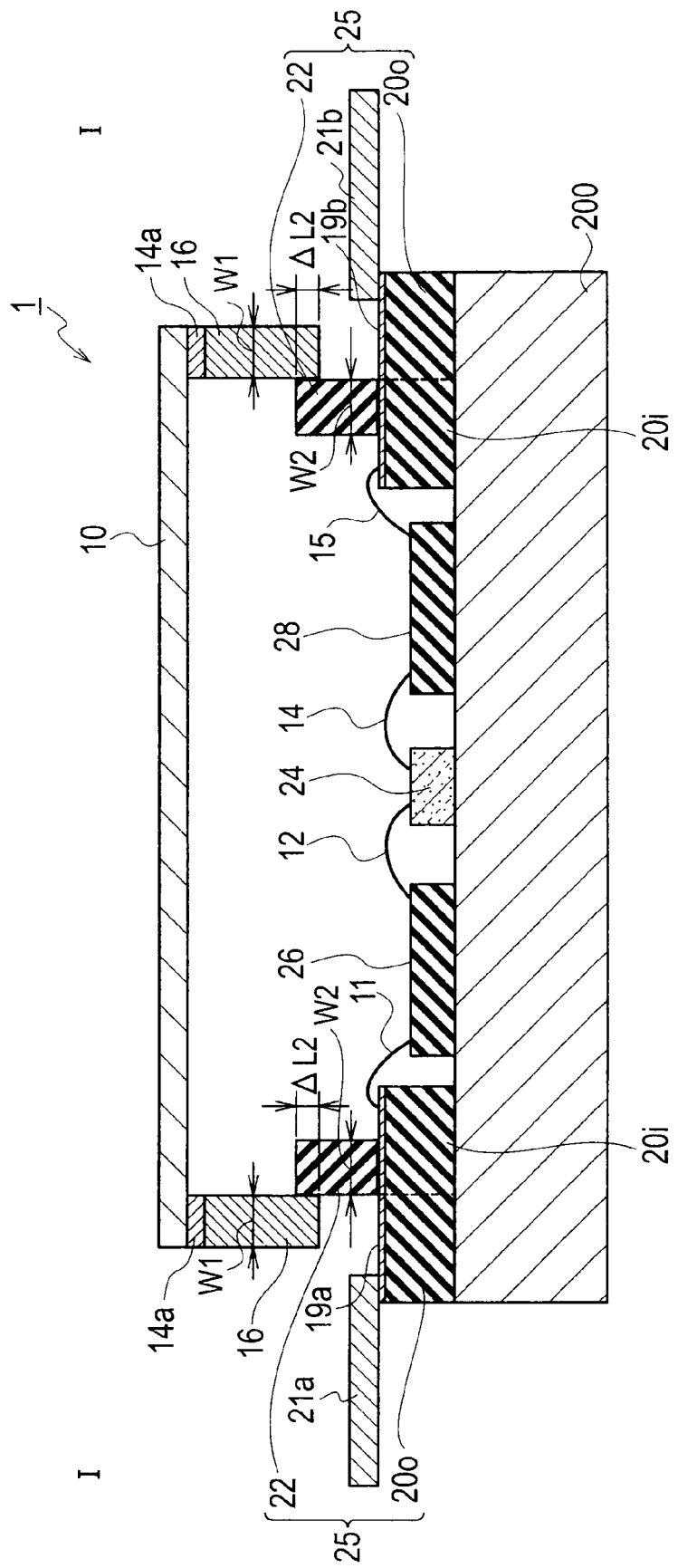
FIG. 3 is a schematic cross-sectional configuration showing the package according to the first embodiment, and is a schematic cross-sectional configuration diagram taken in the line I-I of FIG. 2.
Figure 6:
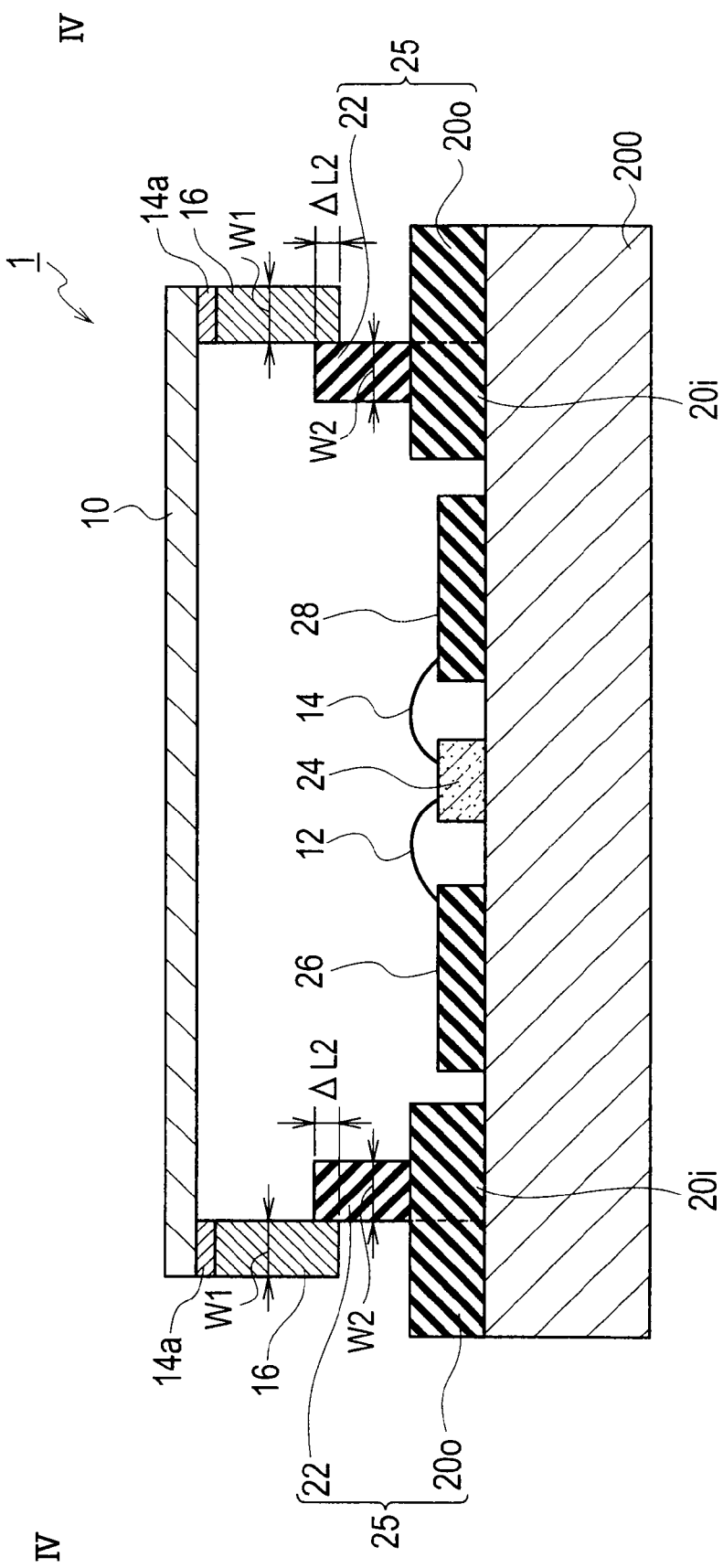
FIG. 6 is a schematic cross-sectional configuration showing the package according to the first embodiment, and is a schematic cross-sectional configuration diagram taken in the line IV-IV of FIG. 2.

As shown in FIG. 3, FIG. 4 and FIG. 6, in the package 1 according to the first embodiment, the outside lower layer feed through $20o$ is surrounded by the metal wall 16.

As shown in FIG. 3, FIG. 4 and FIG. 6, the lengthwise overlap width between the metal wall 16 and the upper layer feed through 22 is expressed as $\Delta L2$. Also, as shown in FIG. 1, FIG. 2, and FIG. 4, the horizontal overlap width between the metal wall 16 and the inside lower layer feed through $20i$ is expressed as $\Delta L1$.

The upper layer feed through 22 is adhered to the sidewalls of the metal wall 16 with silver brazing, for example. The width size of the adhesion portion is about 0.5 mm, for example. Similarly, the contact surface between the lower layer feed through (20i and 20o) and the metal wall 16 is also adhered with silver brazing, for example.

As shown in FIG. 3, FIG. 4 and FIG. 6, the outside lower layer feed through 20o passes through the metal wall 16. The bottom surfaces of the lower layer feed through (20i and 20o) contacts the conductive base plate 200, and the side surface of the lower layer feed through (20i and 20o) contacts the metal wall 16.

Also, the package 1 according to the first embodiment includes: the input stripline 19a disposed on lower layer feed through (20i and 20o), in the input unit of the metal wall 16; and the output stripline 19b disposed on lower layer feed through (20i and 20o), in the output unit of the metal wall 16.

Also, the upper layer feed through 22 is disposed at the inside of the metal wall 16, and is adhered to the sidewall of the metal wall 16 in the internal wall of the metal wall 16 as mentioned above.

Also, as shown in FIG. 3 and FIG. 6, an air gap is provided between the input stripline 19a and the metal wall 16. Since an air layer 23 is disposed between the top surface of the input stripline 19a, and the metal wall 16, reduction of impedance is avoidable.

Also, as shown in FIG. 3, FIG. 4 and FIG. 6, an air gap is provided between the output stripline 19b and the metal wall 16. Since an air layer 23 is disposed between the top surface of the output stripline 19b, and the metal wall 16, reduction of impedance is avoidable.

Also, in the package 1 according to the first embodiment, the lower layer feed through (20i, 20o) includes the inside lower layer feed through 20i disposed at the inside of the metal wall 16, and the outside lower layer feed through 20o disposed at the outside of the metal wall 16. In plane view, the width WL1 of the inside lower layer feed through 20i disposed along the lines of the metal wall 16 is wider than the width WL2 of the outside lower layer feed through 20o, as above-mentioned.

Also, the package 1 according to the first embodiment may include: an input circuit substrate 26 and an output circuit substrate 28 which are adjoining of the semiconductor device 24 and are disposed on the conductive base plate 200 surrounded by the metal wall 16; an input matching circuit 17 which is disposed on the input circuit substrate 26 and is connected to the input stripline 19a; an output matching circuit 18 which is disposed on the output circuit substrate 28 and is connected to the output stripline 19b; bonding wires 12 and 14 connect between the semiconductor device 24, and the input matching circuit 17 and the output matching circuit 18. In addition, between the input stripline 19a and the input matching circuits 17 is connected by the bonding wire 11, and between the output stripline 19b and the output matching circuits 18 is connected by the bonding wire 15.

Also, the package 1 according to the first embodiment may include the metal seal ring 14a disposed on the metal wall 16, and the metal cap 10 disposed on the metal seal ring 14a.

(High Frequency Terminal Structure)

As shown in FIG. 1 to FIG. 6, a high frequency terminal structure according to the first embodiment includes: the metal wall 16; the through-holes 34 formed at both the input and output units of the metal wall 16; the lower layer feed through (20i and 20o) inserted into the through-hole 34; and the upper layer feed through 22 disposed on the inside lower layer feed through 20i, and adhered to the sidewall of the metal wall 16. The outside lower layer feed through 20o is surrounded by the metal wall 16.

The high frequency terminal structure according to the first embodiment may further include the input stripline 19a disposed on the lower layer feed through (20i and 20o) in the input unit of the metal wall 16, and the output stripline 19b disposed on the lower layer feed through (20i and 20o) in the output unit of the metal wall 16.

According to the high frequency terminal structure according to the first embodiment, each of the air layers 23 is formed at each of the top surfaces of the signal lines of the input stripline 19a and the output stripline 19b of the portion surrounded by the metal wall 16, respectively, and thereby reduction of impedance is avoidable. As a result, it can obtain the high frequency terminal structure whose impedance matching is satisfactory, reflection loss is controlled, and characteristics of the electric power capability is improved.

(Fabrication Method for Package)

As shown in FIG. 1, a fabrication method for the package according to the first embodiment includes: forming the conductive base plate 200; forming the semiconductor device 24 on the conductive base plate 200; forming the metal wall 16 on the conductive base plate 200 to house the semiconductor device 24; forming the through-hole 34 at the input and output units of the metal wall 16; inserting the lower layer feed through (20i and 20o) into the through-hole 34 and forming the lower layer feed through (20i and 20o) on the conductive base plate 200; and forming the upper layer feed through 22 on the lower layer feed through 20i while adhering the upper layer feed through 22 to the sidewall of the metal wall 16. In this case, the metal wall 16 is formed so that the outside lower layer feed through 20o is surrounded.

The fabrication method for the package according to the first embodiment may further include: forming the input stripline 19a on lower layer feed through (20i and 20o), in the input unit of the metal wall 16; and forming the output stripline 19b on lower layer feed through (20i and 20o), in the output unit of the metal wall 16.

In the fabrication method for the package according to the first embodiment, the upper layer feed through 22 is formed at the inside of the metal wall 16, and is adhered to the sidewall of the metal wall 16, in the internal wall of the metal wall 16.

The fabrication method for the package according to the first embodiment may further include: forming the input circuit substrate 26 and the output circuit substrate 28 on the conductive base plate 200 surrounded by the metal wall 16 so as to adjoin the semiconductor device 24; forming the input matching circuit 17 connected to the input stripline 19a on the input circuit substrate 26; forming the output matching circuit 18 connected to the output stripline 19b on the output circuit substrate 28; and forming the bonding wires 12 and 14 for connecting the semiconductor device 24 with the input matching circuit 17 and the output matching circuit 18.

The fabrication method for the package according to the first embodiment may further include: forming the metal seal ring 14a on the metal wall 16; and forming the metal cap 10 on the metal seal ring 14a.

(Feed Through Structure)

Figure 7:
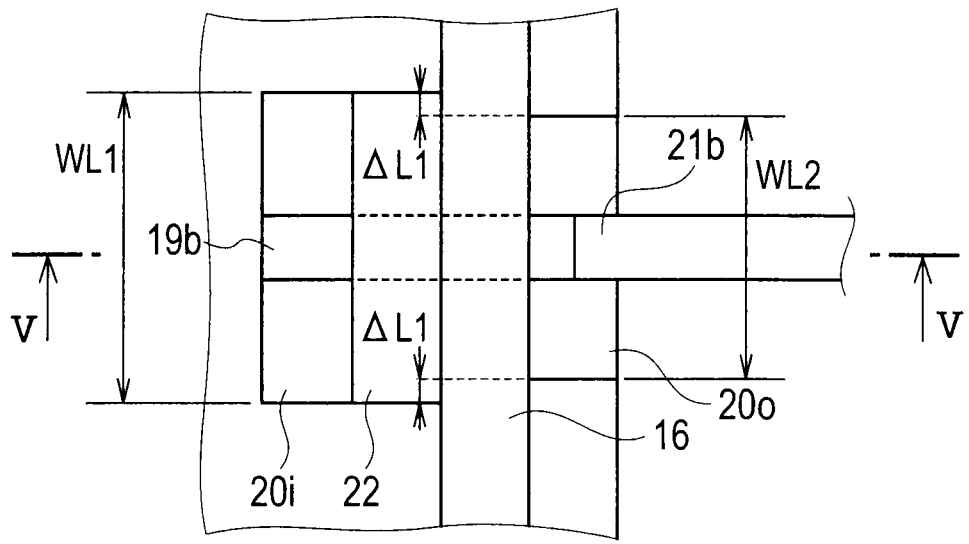
FIG. 7 is a schematic planar pattern configuration diagram showing by enlarging a feed through structure near an output terminal of the package according to the first embodiment.
Figure 8:
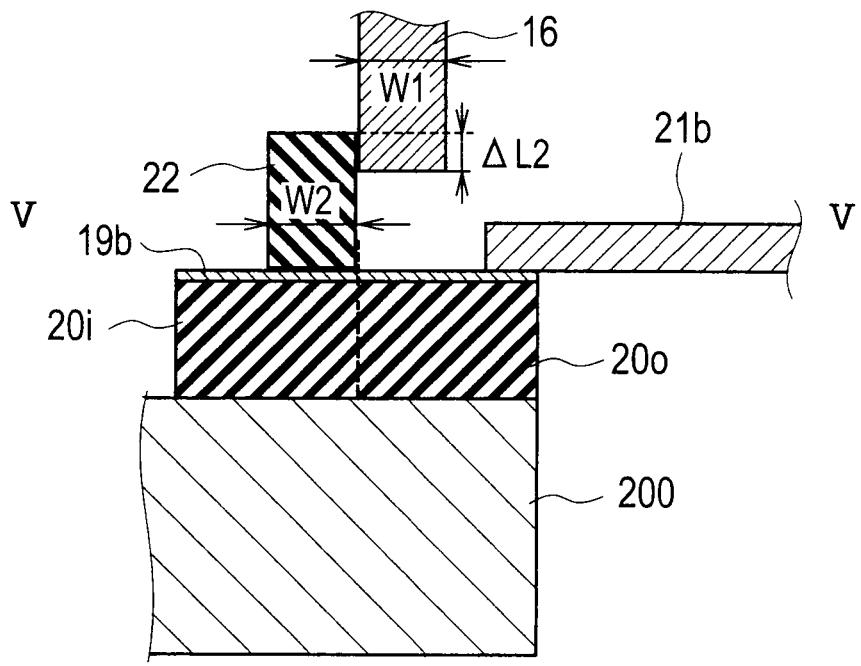
FIG. 8 is a cross-sectional structure showing by enlarging the feed through structure near the output terminal of the package according to the first embodiment, and is a schematic cross-sectional configuration diagram taken in the line V-V of FIG. 7.

A schematic planar pattern configuration showing by enlarging the feed through structure near the output terminal of the package 1 according to the first embodiment is expressed as shown in FIG. 7. Also, a schematic cross-sectional structure taken in the line V-V of FIG. 7 is expressed as shown in FIG. 8.

As shown in FIG. 7, the following formula is satisfied: WL1−WL2=2ΔL1 where WL1 is the width of the inside lower layer feed through 20i disposed along the lines of the metal wall 16 in plane view, WL2 is the width of the outside lower layer feed through 20o disposed along the lines of the metal wall 16 in plane view, and ΔL1 is the horizontal overlap width between the inside lower layer feed through 20i and the metal wall 16 in plane view, as mentioned above. Also, ΔL2 is the lengthwise overlap width between the upper layer feed through 22 and the metal wall 16, in FIG. 8.

In the package 1 according to the first embodiment, the outside lower layer feed through 20o is surrounded by the metal wall 16, and the upper layer feed through 22 is adhered to the sidewall of the metal wall 16, and thereby each of the air layers 23 is formed at each of the top surfaces of the signal lines of input stripline 19a and the output stripline 19b, respectively. Accordingly, reduction of impedance is avoided.

For example, if the feed through structure (comparative example) by which each of the top surfaces of the signal lines of input stripline 19a and the output stripline 19b is surrounded by the metal outer wall is compared with the feed through structure of the package 1 according to the first embodiment by which each of the air layers 23 is formed at each of the top surfaces of the signal lines of the input stripline 19a and the output stripline 19b, the ratio of reduction of impedance is about 40% according to the comparative example, for example. On the other hand, according to the package 1 according to the first embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of electric power capability.

Also, in the configuration example of the package 1 according to the first embodiment, the thickness W2 of the upper layer feed through 22 may be formed of the same grade or widely with (or than) the thickness W1 of the metal wall 16.

(Configuration of Semiconductor Device)

Figure 9A:
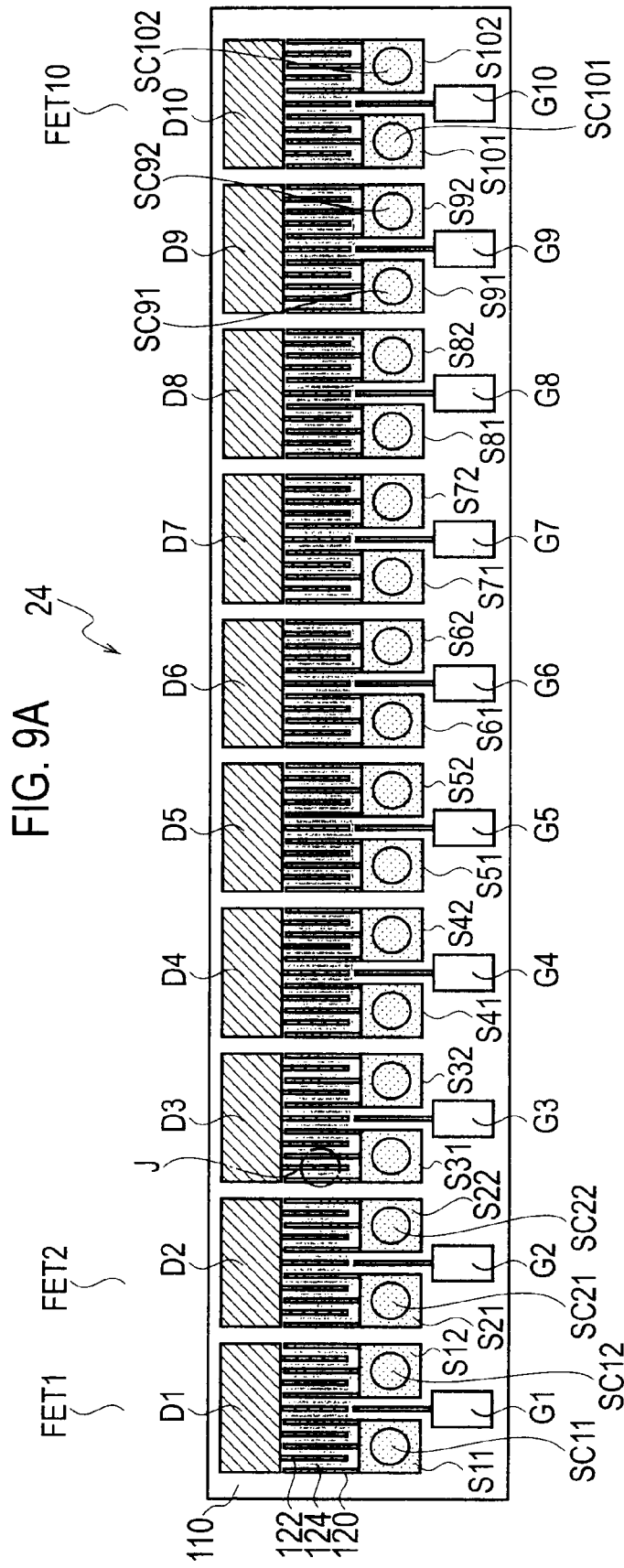
FIG. 9A shows an example of schematic planar pattern configuration of a semiconductor device which can be mounted in the package according to the first embodiment.
Figure 9B:
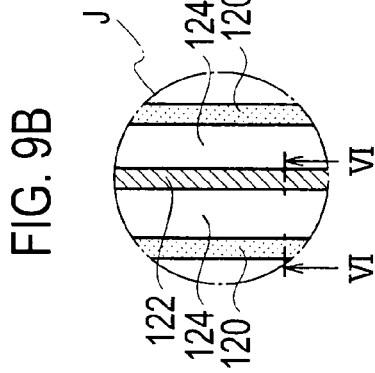
FIG. 9B is an enlarged drawing of a part J of FIG. 9A.

A schematic planar pattern configuration of the semiconductor device 24 which can be mounted on the package according to the first embodiment is expressed as shown in FIG. 9A, and an enlarged drawing of a part J of FIG. 9A is expressed as shown in FIG. 9B. Also, configuration examples 1-4 of the semiconductor device 24 which can be mounted on the package according to the first embodiment, and schematic cross-sectional configuration examples 1-4 taken in the line II-II of FIG. 9B are expressed as shown in FIG. 10 to FIG. 13, respectively.

In the semiconductor device 24 which can be mounted in the package according to the first embodiment, as shown in FIG. 9 to FIG. 13, a plurality of FET cells FET 1 to FET 10 include: a semi-insulating substrate 110; a gate finger electrode 124, a source finger electrode 120, and a drain finger electrode 122 which are disposed on a first surface of the semi-insulating substrate 110, and have a plurality of fingers, respectively; a plurality of gate terminal electrodes G1, G2, . . . , G10, a plurality of source terminal electrodes S11, S12, S21, S22, . . . , S101, and S102 and the drain terminal electrodes D1, D2, D10 which are disposed on the first surface of the semi-insulating substrate 110, and ties a plurality of fingers, respectively every the gate finger electrode 124, the source finger electrode 120, and the drain finger electrode 122; VIA holes SC11, SC12, SC21, SC22, . . . , SC101, and SC102 disposed at the lower part of the source terminal electrodes S11, S12, S21, S22, . . . , S101, and S102; and a ground electrode (not shown) which is disposed on a second surface of the opposite side of a first surface of the semi-insulating substrate 110, and is connected via the VIA holes SC11, SC12, SC21, SC22, . . . , SC101, and SC102 to the source terminal electrodes S11, S12, S21, S22, . . . , S101, and S102.

The bonding wire 12 is connected to the gate terminal electrodes G1, G2, . . . , G10, as already shown in FIG. 2, and the bonding wire 14 is connected to the drain terminal electrodes D1, D2, . . . , D10. The source terminal electrodes S11, S12, S21, S22, . . . , S101, and S102 are connected to the ground electrode (not shown), via the barrier metal layers (not shown) formed in the internal wall of the VIA holes SC11, SC12, SC21, SC22, . . . , SC101 and SC102, and via the filling metal layers (not shown) formed on the barrier metal layers and filled up with the VIA holes.

The semi-insulating substrate 110 is either of a GaAs substrate, an SiC substrate, a GaN substrate, a substrate in which a GaN epitaxial layer is formed on the SiC substrate, a substrate which a heterojunction epitaxial layer composed of GaN/AlGaN is formed on the SiC substrate, a sapphire substrate or a diamond substrate.

Constructional Example 1

Figure 10:
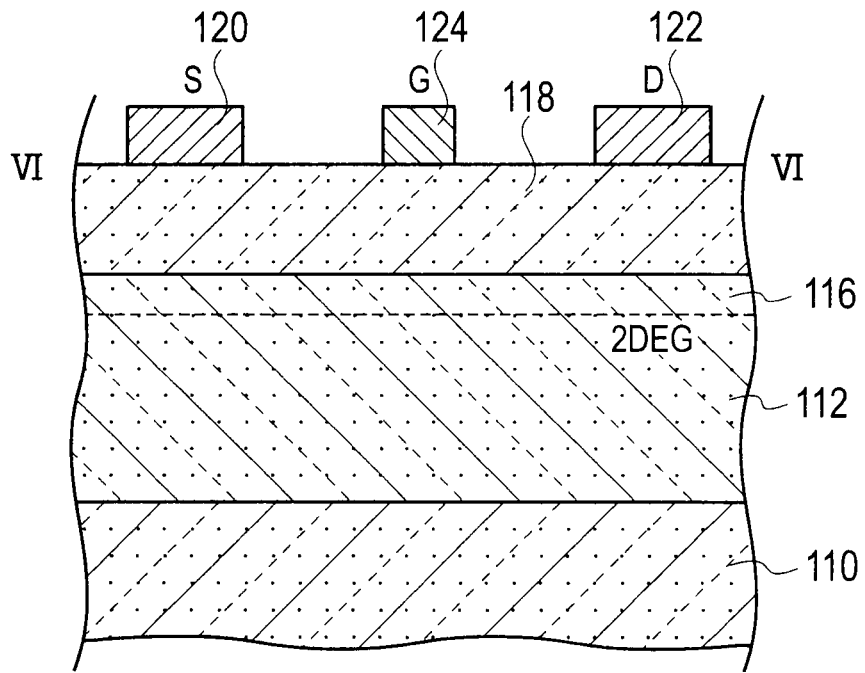
FIG. 10 shows a constructional example 1 of the semiconductor device which can be mounted in the package according to the first embodiment, and is a schematic cross-sectional configuration diagram taken in the line VI-VI of FIG. 9B.

As shown in FIG. 10, a configuration example 1 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; and a source finger electrode (S) 120, a gate finger electrode (G) 124, and a drain finger electrode (D) 122 which are disposed on the aluminum gallium nitride layer ($Al_xGa_{1-x}N$) (where $0.1<=x<=1$) 118. A two dimensional electron gas (2DEG) layer 116 is formed in the interface between the nitride based compound semiconductor layer 112 and the aluminum gallium nitride layer ($Al_xGa_{1-x}N$) (where $0.1<=x<=1$) 118. FIG. 10 shows a High Electron Mobility Transistor (HEMT) as the constructional example 1.

Constructional Example 2

Figure 11:
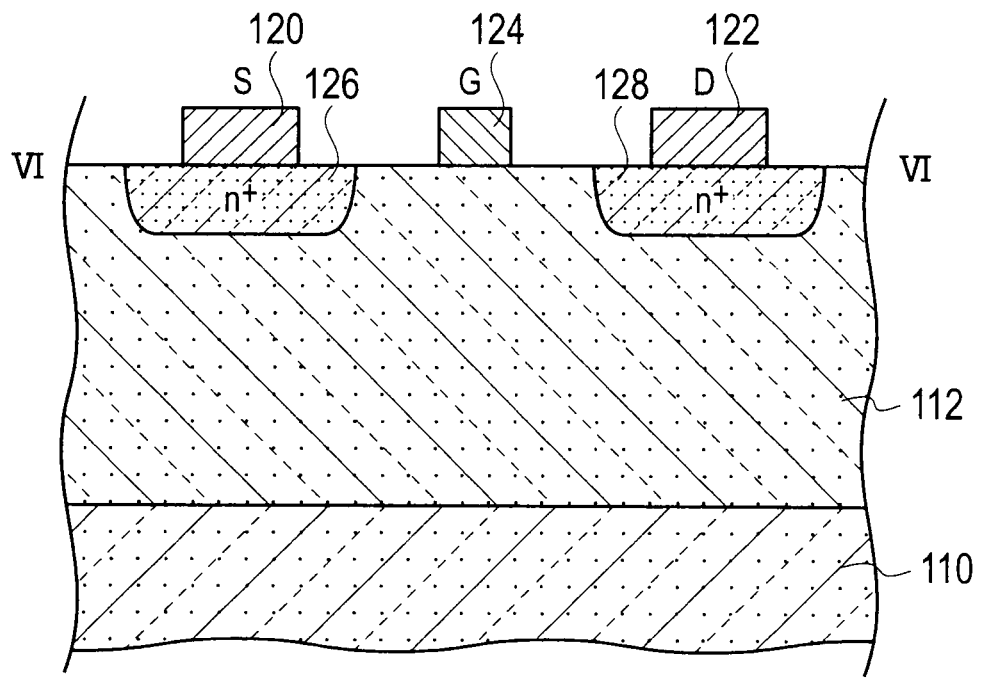
FIG. 11 shows a constructional example 2 of the semiconductor device which can be mounted in the package according to the first embodiment, and is a schematic cross-sectional configuration diagram taken in the line VI-VI of FIG. 9B.

As shown in FIG. 11, a constructional example 2 of an FET cell of the semiconductor device 24 which can be mounted in the package according to the first embodiment includes: a semi-insulating substrate 110; a nitride based compound semiconductor layer 112 disposed on the semi-insulating substrate 110; a source region 126 and a drain region 128 which are disposed on the nitride based compound semiconductor layer 112; and a source finger electrode (S) 120 disposed on the source region 126, a gate finger electrode (G) 124 disposed on the nitride based compound semiconductor layer 112, and a drain finger electrode (D) 122 disposed on the drain region 128. Schottky contact is formed in the interface between the nitride based compound semiconductor layer 112 and the gate finger electrode (G) 124. FIG. 11 shows a Metal Semiconductor Field Effect Transistor (MESFET) as the constructional example 2.

Constructional Example 3

Figure 12:
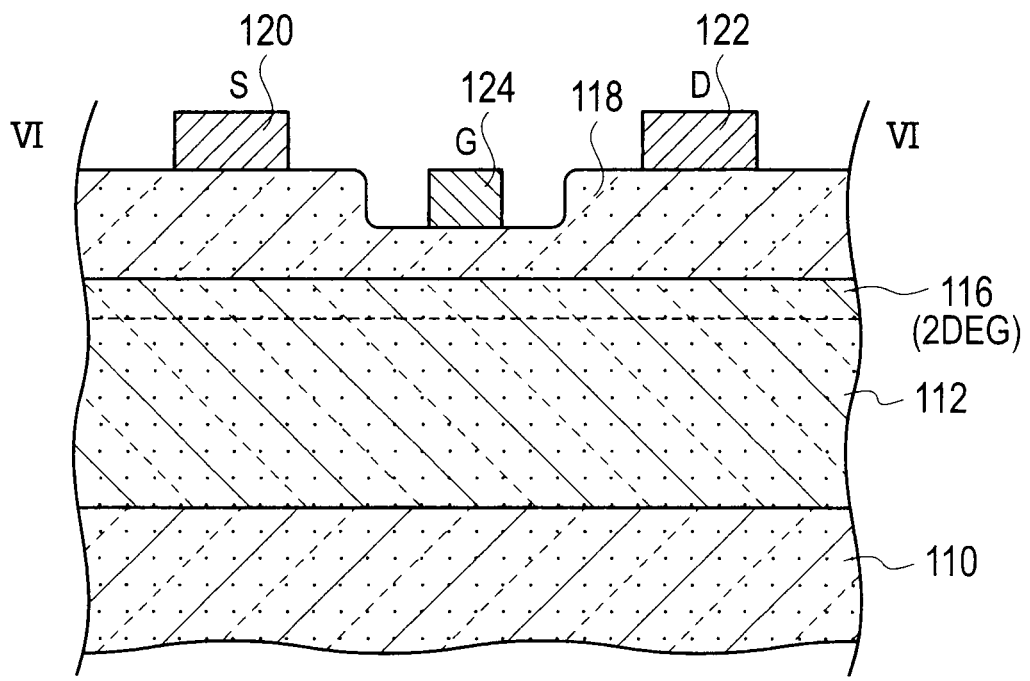
FIG. 12 shows a constructional example 3 of the semiconductor device which can be mounted in the package according to the first embodiment, and is a schematic cross-sectional configuration diagram taken in the line VI-VI of FIG. 9B.

As shown in FIG. 12, a constructional example 3 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$)

(where $0.1 \leq x \leq 1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1 \leq x \leq 1$) 118; and a gate finger electrode (G) 124 disposed at a recessed part on the aluminum gallium nitride layer ($Al_xGa_{1-x}N$) (where $0.1 \leq x \leq 1$) 118. The 2DEG layer 116 is formed in the interface between the nitride based compound semiconductor layer 112 and the aluminum gallium nitride layer ($Al_xGa_{1-x}N$) (where $0.1 \leq x \leq 1$) 118. FIG. 12 shows HEMT as the constructional example 3.

Constructional Example 4

Figure 13:
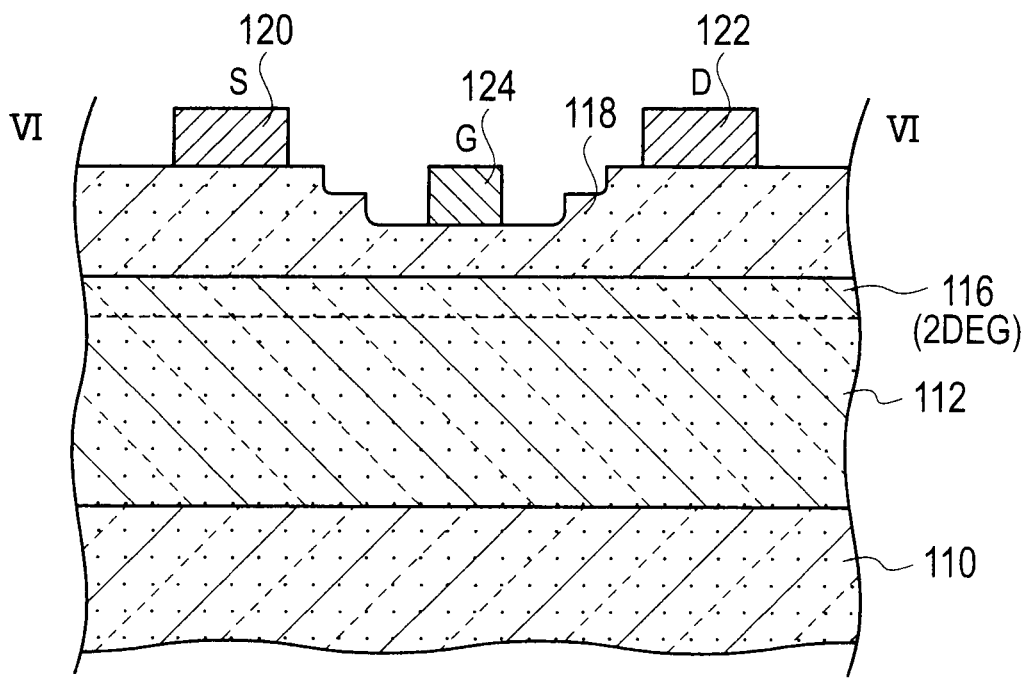
FIG. 13 shows a constructional example 4 of the semiconductor device which can be mounted in the package according to the first embodiment, and is a schematic cross-sectional configuration diagram taken in the line VI-VI of FIG. 9B.
Figure 14A:
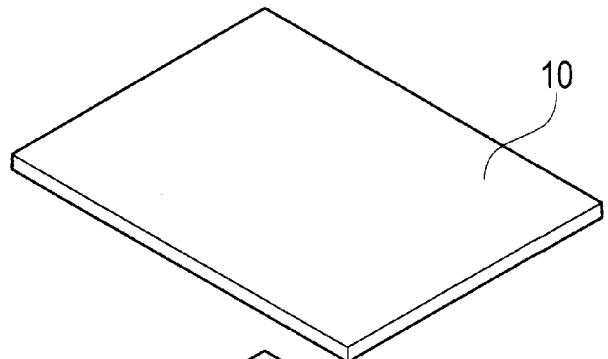
FIG. 14A is a schematic bird's-eye view showing a package according to a second embodiment, and is a schematic configuration diagram showing a metal cap 10.
Figure 14B:
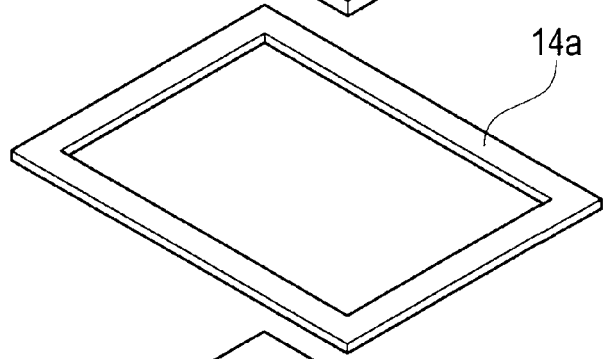
Figure 14C:
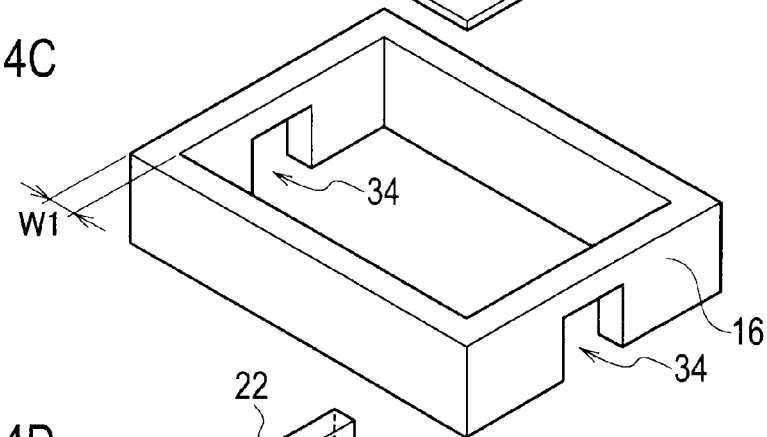
FIG. 14C is a schematic bird's-eye view showing the package according to the second embodiment, and is a schematic configuration diagram showing a metal wall 16.
Figure 14D:
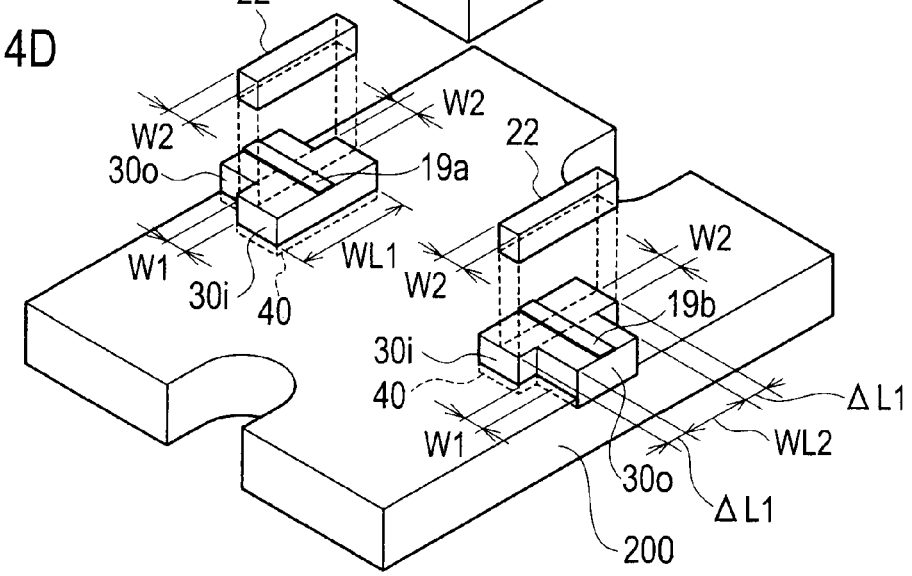
FIG. 14D is a schematic bird's-eye view showing the package according to the second embodiment, and is a schematic configuration diagram showing a lower layer feed through (20i and 20o) on a conductive base plate 200 including counter boring units 40, and an input stripline 19a and an output stripline 19b on the lower layer feed through (20i and 20o), and an upper layer feed-through 22 on the lower layer feed through 20i.

As shown in FIG. 13, a constructional example 4 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1 \leq x \leq 1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1 \leq x \leq 1$) 118; and a gate finger electrode (G) 124 disposed at a two-step recessed part on the aluminum gallium nitride layer ($Al_xGa_{1-x}N$) (where $0.1 \leq x \leq 1$) 118. The 2DEG layer 116 is formed in the interface between the nitride based compound semiconductor layer 112 and the aluminum gallium nitride layer ($Al_xGa_{1-x}N$) (where $0.1 \leq x \leq 1$) 118. FIG. 13 shows HEMT as the constructional example 4.

Moreover, in the above-mentioned constructional examples 1-4, the nitride based compound semiconductor layer 112 except an active area is electrically used as an inactivity isolation region. Here, the active area is composed of the source finger electrode 120, the 2DEG layer 116 directly under the gate finger electrode 124 and the drain finger electrode 122, and the 2DEG layer 116 between the source finger electrode 120 and the gate finger electrode 124 and between the drain finger electrode 122 and the gate finger electrode 124.

As another fabrication method for the isolation region, it can also form by ion implantation to a part of depth direction of the aluminum gallium nitride layer ($Al_xGa_{1-x}N$) (where $0.1 \leq x \leq 1$) 18 and the nitride based compound semiconductor layer 112. As ion species, nitrogen (N), argon (Ar), etc. are applicable, for example. Moreover, the amount of dosage with the ion implantation is about $1 \times 10^{14}$ (ions/$cm^2$), for example, and accelerating energy is about 100 keV to 200 keV, for example.

On the isolation region and the device surface, an insulating film for passivation (not shown) is formed. As the insulating film, it can be formed of a nitride film, an alumina ($Al_2O_3$) film, an oxide film ($SiO_2$), an oxynitriding film (SiON), etc. deposited by a Plasma Enhanced Chemical Vapor Deposition (PECVD) method, for example.

The source finger electrode 120 and the drain finger electrode 122 are formed of Ti/Al etc., for example. The gate finger electrode 124 can be formed, for example of Ni/Au etc.

In addition, in the semiconductor device 24 which can be mounted in the package according to the first embodiment, the pattern length of the longitudinal direction of the gate finger electrode 124, the source finger electrode 120, and the drain finger electrode 122 is set up to be short as the operating frequency becomes higher such as the microwave/millimeter wave/submillimeter wave. For example, in the millimeter wave band, the pattern length is about 25 μm to 50 μm.

Also, the width of the source finger electrode 120 is about 40 μm, for example, and the width of the source terminal electrode S11, S12, S21, S22, . . . , S101, and S102 is about 100 μm, for example. Yet also, the formation width of the VIA holes SC11, SC12, SC21, SC22, . . . , SC101, and SC102 is about 10 μm to about 40 μm, for example.

According to the first embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the first embodiment, it can provide the high airtight package used for the microwave band semiconductor device and the fabrication method for such package, and the high frequency terminal structure.

Second Embodiment

A schematic bird's-eye view configuration for explaining a package according to a second embodiment is expressed as shown in FIG. 14. FIG. 14A shows a schematic configuration of a metal cap 10. FIG. 14B shows a schematic configuration of a metal seal ring 14a. FIG. 14C shows a schematic configuration of a metal wall 16. FIG. 14D shows a schematic configuration of a lower layer feed through (30i and 30o) on a conductive base plate 200 provided with a counter boring unit 40, an input stripline 19a and an output stripline 19b on the lower layer feed through (30i, and 30o), and an upper layer feed through 22 on the lower layer feed through 30i.

A schematic planar pattern configuration of the package 1 according to the second embodiment is similarly expressed as FIG. 2.

Figure 15:
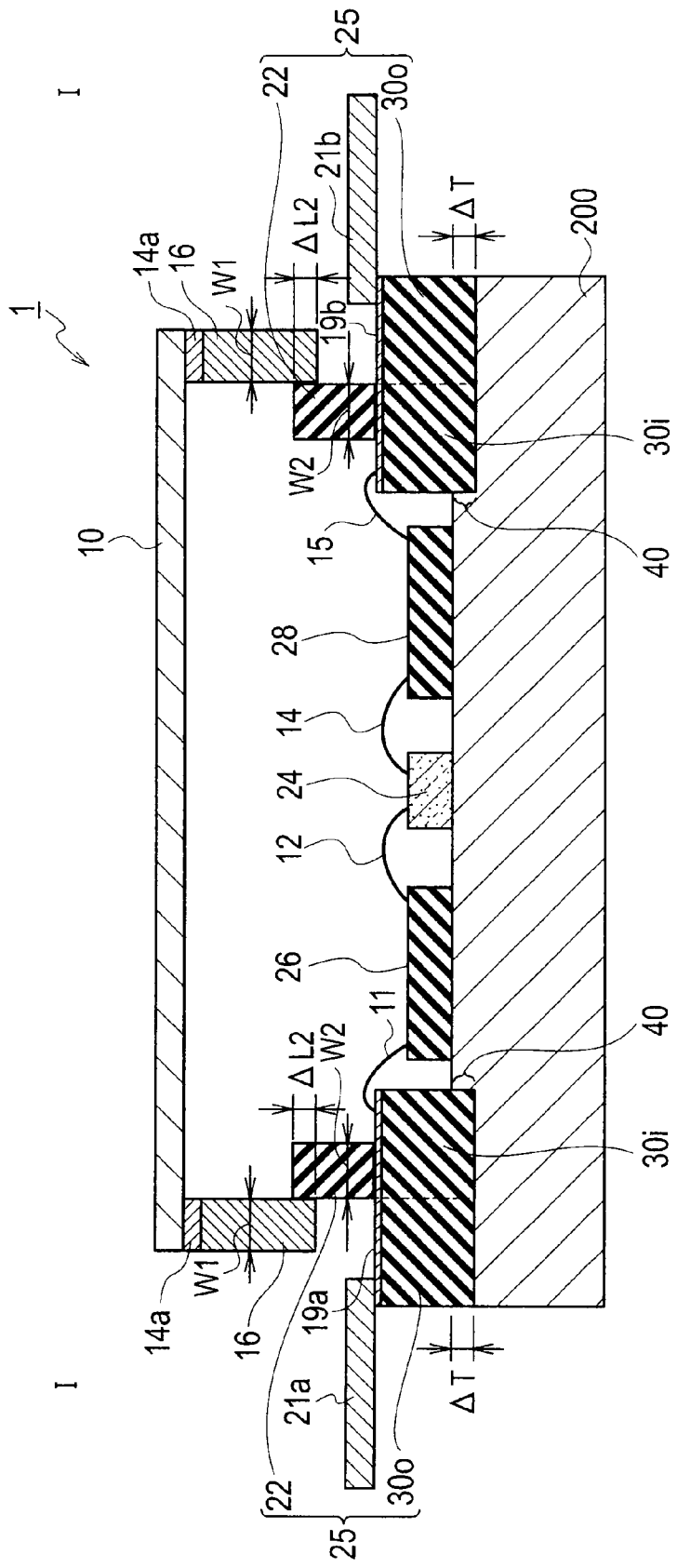
FIG. 15 is a schematic cross-sectional configuration showing the package according to the second embodiment, and is a schematic cross-sectional configuration diagram taken in the line I-I of FIG. 2.
Figure 16:
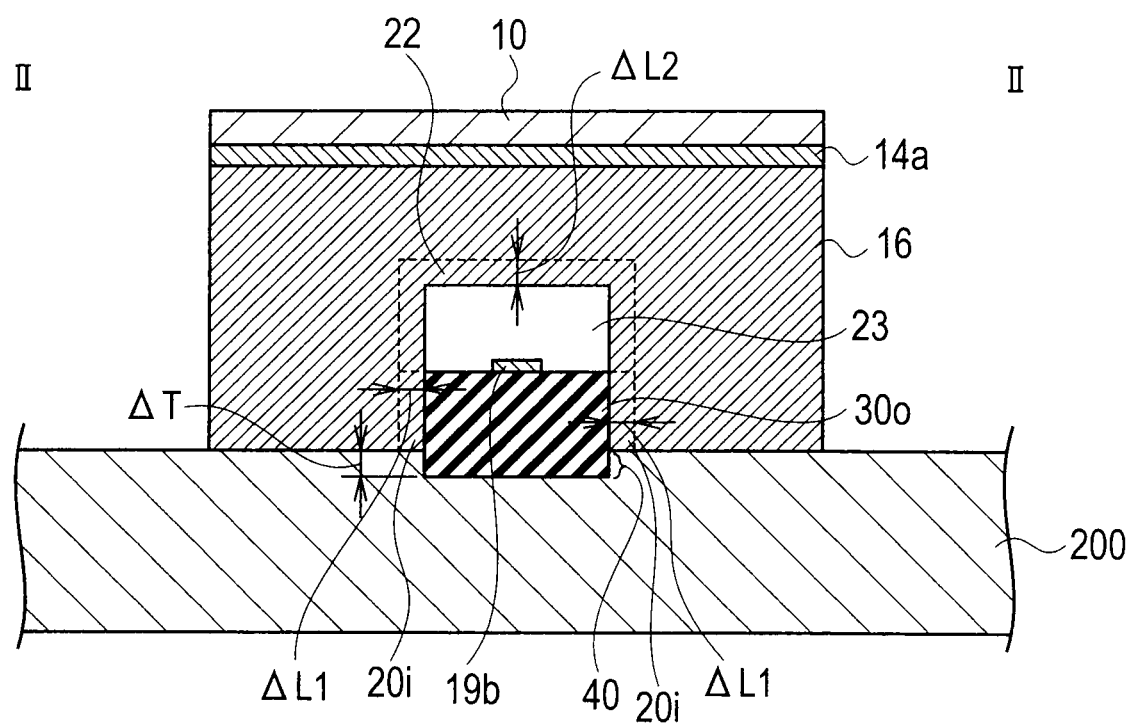
FIG. 16 is a schematic cross-sectional configuration showing the package according to the second embodiment, and is a schematic cross-sectional configuration diagram taken in the line II-II of FIG. 2.
Figure 17:
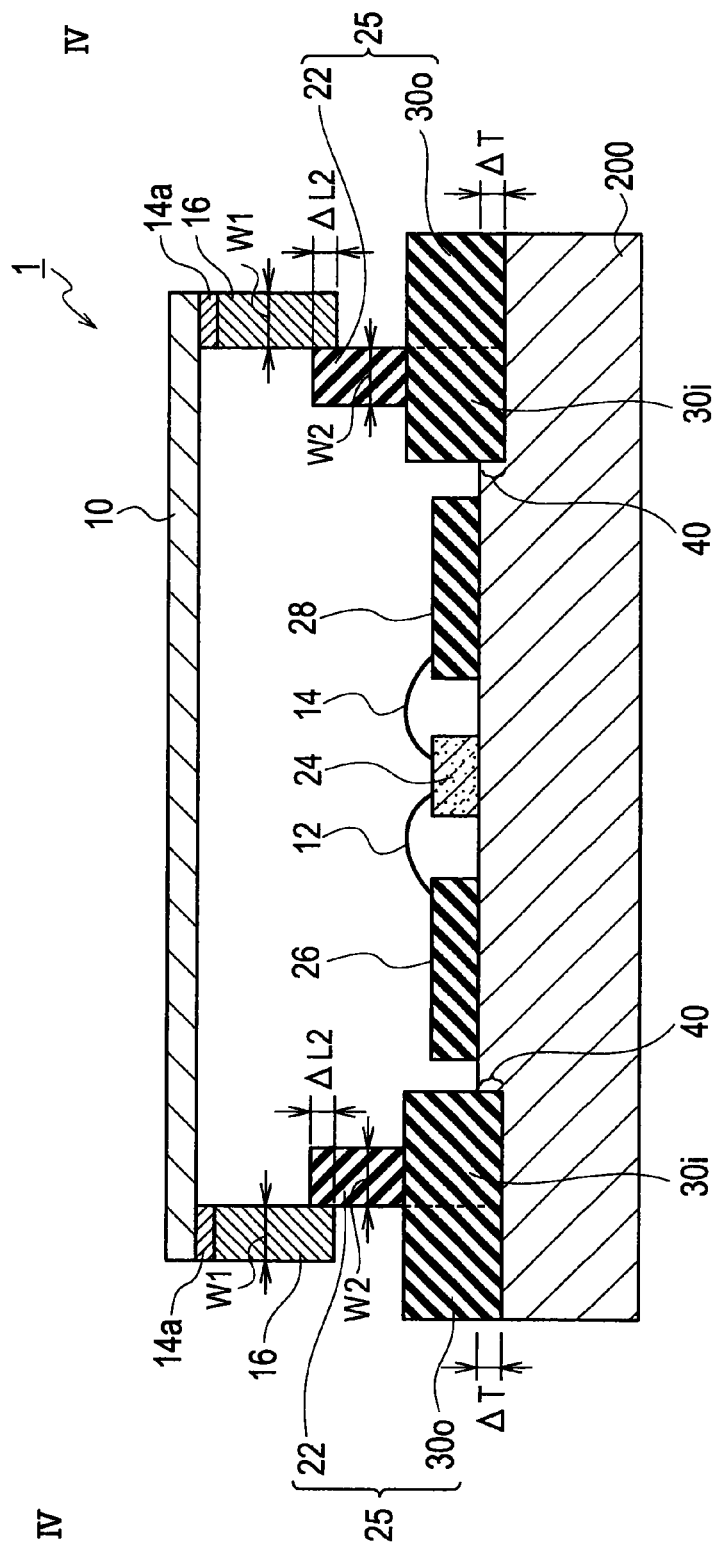
FIG. 17 is a schematic cross-sectional configuration showing the package according to the second embodiment, and is a schematic cross-sectional configuration diagram taken in the line IV-IV of FIG. 2.

A schematic cross-sectional configuration of the package according to the second embodiment, and a schematic cross-sectional structure taken in the line I-I of FIG. 2 is expressed as shown in FIG. 15, a schematic cross-sectional structure taken in the line II-II of FIG. 2 is expressed as shown in FIG. 16, and a schematic cross-sectional structure taken in the line IV-IV of FIG. 2 is expressed as shown in FIG. 17.

As shown in FIG. 14 to FIG. 17, in the package 1 according to the second embodiment, the conductive base plate 200 includes the counter boring unit 40, and the lower layer feed through (30i and 30o) is disposed on the counter boring unit 40 of the conductive base plate 200. The counter boring depth ΔT of the counter boring unit 40 is about 0.1 mm to 0.5 mm, for example. Duplicating explanation is omitted since other configurations are the same as that of the package according to the first embodiment.

According to the second embodiment, since the lower layer feed through (30i and 30o) can be disposed in the counter boring unit 40 by using the conductive base plate 200 including the counter boring unit 40, it can prevent the displacement between the convex feed-through 25 composed of the lower layer feed through (30i and 30o) and the upper layer feed through 22, and the metal wall 16.

(Semiconductor Element Structure)

An example of a schematic planar pattern configuration of the semiconductor device 24 which can be mounted in the package according to the second embodiment is similarly expressed as FIG. 9A and FIG. 9B. Also, configuration examples 1-4 of the semiconductor device 24 which can be mounted in the package according to the second embodiment are similarly expressed as FIG. 10 to FIG. 13, respectively. Therefore, the duplicating explanation will be omitted.

(High Frequency Terminal Structure)

As shown in FIG. 14 to FIG. 17, a high frequency terminal structure according to the second embodiment includes: the metal wall 16; the through-holes 34 formed at both the input and output units of the metal wall 16; the lower layer feed through (30i and 30o) inserted into the through-hole 34; and the upper layer feed through 22 disposed on the inside lower layer feed through 30i, and adhered to the sidewall of the metal wall 16. The outside lower layer feed through 30o is surrounded by the metal wall 16.

The high frequency terminal structure according to the second embodiment may further include the input stripline 19a disposed on the lower layer feed through (30i and 30o) in the input unit of the metal wall 16, and the output stripline 19b disposed on the lower layer feed through (30i and 30o) in the output unit of the metal wall 16.

According to the high frequency terminal structure according to the second embodiment, each of the air layers 23 are formed at each of the top surfaces of the signal lines of the input stripline 19a and the output stripline 19b of the portion surrounded by the metal wall 16, respectively, and thereby reduction of impedance is avoidable. As a result, it can obtain the high frequency terminal structure whose impedance matching is satisfactory, reflection loss is controlled, and characteristics of the electric power resistance.

(Fabrication Method for Package)

A fabrication method for the package according to the second embodiment includes forming the counter boring unit 40 on the conductive base plate 200, as shown in FIG. 14. In this case, the counter boring unit 40 can be formed by implementing dry etching or wet etching, for example to the conductive base plate 200. Alternatively, the counter boring unit 40 may be formed beforehand in the formation process of the conductive base plate 200.

Therefore, in the fabrication method for the package according to the second embodiment, the step of forming the lower layer feed through (30i and 30o) includes forming the lower layer feed through (30i and 30o) on the counter boring unit 40 of the conductive base plate 200. Therefore, duplicating explanation is omitted since other steps are the same as that of the fabrication method for the package according to the first embodiment.

According to the second embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the second embodiment, it can provide the high airtight package which can prevent the displacement between the convex feed-through and the metal wall, by using the conductive base plate including the counter boring unit.

According to the embodiments, it can provide the high airtight package used for the microwave band semiconductor device and the fabrication method for such package, and the high frequency terminal structure.

The Other Embodiments

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

In addition, as the semiconductor device mounted in the package according to the embodiments, it needless to say that not only the FET and HEMT but also amplifying elements, such as a Laterally Diffused Metal-Oxide-Semiconductor Field Effect Transistor (LDMOS) and a Hetero-junction Bipolar Transistor (HBT), and a Micro Electro Mechanical Systems (MEMS) element, etc. are applicable.

Thus, it includes various embodiments etc. which have not been described in this specification.

What is claimed is:

1. A package comprising:
a conductive base plate;
a semiconductor device configured to be disposed on the conductive base plate;
a metal wall configured to be disposed on the conductive base plate to house the semiconductor device;
a through-hole configured to be disposed in input and output units of the metal wall;
a lower layer feed through configured to be inserted into the through-hole and disposed on the conductive base plate; and
an upper layer feed through configured to be disposed on the lower layer feed through, and adhered to a sidewall of the metal wall, wherein
the lower layer feed through is surrounded by the metal wall, wherein
a width of a part of the lower layer feed through is larger than that of the through-hole, the lower layer feed through is adhered to the sidewall of the metal wall, and a width of the upper layer feed through is larger than that of the through-hole, wherein
the through-hole is airtight-sealed from an inside of the metal wall with the lower layer feed through and the upper layer feed through disposed on the lower layer feed through.

2. The package according to claim 1 further comprising:
an input stripline configured to be disposed on the lower layer feed through in the input unit of the metal wall; and
an output stripline configured to be disposed on the lower layer feed through in the output unit of the metal wall.

3. The package according to claim 1, wherein the upper layer feed through is disposed at an inside of the metal wall, and is adhered to the sidewall of the metal wall in an internal wall of the metal wall.

4. The package according to claim 1, wherein
an air layer is formed between an input stripline and the metal wall.

5. The package according to claim 1, wherein
an air layer is formed between an output stripline and the metal wall.

6. The package according to claim 1, wherein
the lower layer feed through comprises:
an inside lower layer feed through configured to be disposed at an inside of the metal wall; and
an outside lower layer feed through configured to be disposed at an outside of the metal wall, wherein
the width of the inside lower layer feed through disposed along the lines of the metal wall in plane view is wider than the width of the outside lower layer feed through.

7. The package according to claim 6 further comprising:
an input circuit substrate and an output circuit substrate configured to be disposed on the conductive base plate surrounded by the metal wall so as to adjoin to the semiconductor device;
an input matching circuit configured to be disposed on the input circuit substrate and be connected to an input stripline;
an output matching circuit configured to be disposed on the output circuit substrate and be connected to an output stripline; and
a bonding wire configured to connect between the semiconductor device, and the input matching circuit and the output matching circuit.

8. The package according to claim 7 further comprising:
a metal seal ring configured to be disposed on the metal wall; and
a metal cap configured to be disposed on the metal seal ring.

9. The package according to claim 1, wherein
the conductive base plate includes a counter boring unit, and the lower layer feed through is disposed on the counter boring unit of the conductive base plate.

10. The package according to claim 1, wherein
the semiconductor device comprises:
a semi-insulating substrate;
a gate finger electrode, a source finger electrode, and a drain finger electrode configured to be disposed on a first surface of the semi-insulating substrate, and configured to have a plurality of fingers, respectively;
a plurality of gate terminal electrodes, a plurality of source terminal electrodes, and a drain terminal electrode configured to be disposed on the first surface of the semi-insulating substrate, and configured to tie a plurality of fingers, respectively for every the gate finger electrode, the source finger electrode, and the drain finger electrode;
a VIA hole configured to be disposed at a lower part of the source terminal electrode; and
a ground electrode configured to be disposed on a second surface of the opposite side of the first surface of the semi-insulating substrate, and configured to be connected via the VIA hole for the source terminal electrode.

11. The package according to claim 10, wherein
the semi-insulating substrate is one of a GaAs substrate, an SiC substrate, a GaN substrate, a substrate formed of a GaN epitaxial layer on the SiC substrate, a substrate formed of a heterojunction epitaxial layer composed of GaN/AlGaN on the SiC substrate, a sapphire substrate, or a diamond substrate.

12. A high frequency terminal structure of a package comprising:
a metal wall;
a through-hole configured to be disposed in input and output units of the metal wall;
a lower layer feed through configured to be inserted into the through-hole; and
an upper layer feed through configured to be disposed on the lower layer feed through, and configured to be adhered to a sidewall of the metal wall, wherein
the lower layer feed through is surrounded by the metal wall, wherein
a width of a part of the lower layer feed through is larger than that of the through-hole, the lower layer feed through is adhered to the sidewall of the metal wall, and a width of the upper layer feed through is larger than that of the through-hole, wherein
the through-hole is airtight-sealed from an inside of the metal wall with the lower layer feed through and the upper layer feed through disposed on the lower layer feed through.

13. The high frequency terminal structure according to claim 12 further comprising:
an input stripline configured to be disposed on the lower layer feed through in the input unit of the metal wall; and
an output stripline configured to be disposed on the lower layer feed through in the output unit of the metal wall.

* * * * *